(12) United States Patent
Kim

(10) Patent No.: US 7,242,476 B2
(45) Date of Patent: Jul. 10, 2007

(54) ALIGNMENT MEASURING SYSTEM AND METHOD OF DETERMINING ALIGNMENT IN A PHOTOLITHOGRAPHY PROCESS

(75) Inventor: Young-Lae Kim, Pyeongtack-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 500 days.

(21) Appl. No.: 10/821,890

(22) Filed: Apr. 12, 2004

(65) Prior Publication Data

US 2004/0263828 A1    Dec. 30, 2004

(30) Foreign Application Priority Data

Jun. 25, 2003    (KR) .................. 10-2003-0041399

(51) Int. Cl.
    *G01B 11/00*    (2006.01)
(52) U.S. Cl. ........................................ 356/400; 356/73
(58) Field of Classification Search .................. 385/16; 359/249, 156; 372/106; 356/73
    See application file for complete search history.

(56) References Cited

U.S. PATENT DOCUMENTS

| 4,473,293 | A |   | 9/1984 | Phillips |
|---|---|---|---|---|
| 4,917,452 | A |   | 4/1990 | Liebowitz |
| 5,251,057 | A | * | 10/1993 | Guerin et al. ............... 359/249 |
| 5,627,669 | A | * | 5/1997 | Orino et al. ................ 398/129 |
| 5,712,470 | A | * | 1/1998 | Katz et al. .............. 235/462.32 |
| 6,181,728 | B1 | * | 1/2001 | Cordingley et al. ........ 372/106 |
| 6,299,312 | B1 |   | 10/2001 | Choi et al. |
| 6,320,993 | B1 | * | 11/2001 | Laor ........................... 385/16 |
| 2002/0167645 | A1 |   | 11/2002 | Johnson |
| 2004/0263828 | A1 | * | 12/2004 | Kim ........................... 356/73 |

* cited by examiner

*Primary Examiner*—N. Drew Richards
*Assistant Examiner*—Tara S. Pajoohi
(74) *Attorney, Agent, or Firm*—Volentine & Whitt, P.L.L.C.

(57) ABSTRACT

An alignment measuring system includes a focusing diode, a light source, an image sensor, first and second splitters, and a controller. The first splitter directs a portion of light from the light source toward a wafer, and directs light returned by the wafer to the second splitter. The second splitter directs a first portion of the light toward the image sensor, and a second portion of the light toward the focusing diode, and control the ratio of the first and second portions in response to a control signal from the controller. The image sensor receives the first portion of light and produces a detection signal. The controller receives the detection signal, determines an alignment state of the wafer, and controls a stage to align and position the wafer.

17 Claims, 1 Drawing Sheet

ALIGNMENT MEASURING SYSTEM AND METHOD OF DETERMINING ALIGNMENT IN A PHOTOLITHOGRAPHY PROCESS

CROSS REFERENCES TO RELATED APPLICATIONS

This application claims priority under 35. U.S.C. § 119 from Korean Patent Application 2003-41399, filed on Jun. 25, 2003, the contents of which are hereby incorporated by reference in their entirety for all purposes as if fully set forth herein.

BACKGROUND AND SUMMARY

1. Technical Field

The present invention relates to an alignment measuring system in a photolithography process that is capable of enhancing a measurement precision for an alignment mark on a wafer.

2. Description

A photolithography process is provided to prescribe respective different pattern images that a plurality of reticles has on a wafer. The pattern images are sequentially transferred onto the wafer, to thus become a required circuit pattern through a process such as etching, film deposition, etc.

In this photolithography process, it is important that a design of a precise circuit pattern and each different pattern layer constituting a circuit pattern are precisely mutually aligned and overlaid.

At present, in managing the overlay there are many efforts to realize a more integrated and precise circuit pattern by revising the reticle pattern, changing the photoresist, etc.

Herewith, the size of the pattern is almost determined by the specifications of the equipment and the photoresist, but an improvement for the overlay of each pattern image is being successively required as a regular preventive maintenance or a development of a measuring system.

An ultimate purpose of overlay management is to exactly overlay the pattern layer of the transferred pattern image with an existing pattern layer(s), and to provide data for a continuous execution of a process involving developing or correcting misalignment of the existing pattern, and to provide a standard to determine whether or not rework should be performed through the measurement of the overlay.

Thus, in order to precisely align the pattern layers through exact detection data for an alignment state of a wafer and a reticle, it is required to exactly detect a position of an alignment mark that indicates an alignment state of the wafer.

A system for measuring a position of an alignment mark in aligning a wafer will be described as follows, referring to FIG. 1.

According to the prior art, with reference to FIG. 1, the alignment measuring system includes a light source 14, first and second splitters 16 and 20, a reference mirror 22, a focusing diode 18, and an image sensor 12.

The alignment measuring system operates with a stage 10 on which a wafer is positioned. The stage 10 is adapted to rotate by a given angle in a horizontal (X-axis) direction, and a vertical (Y-axis) direction, and to be ascendible and descendible with a height control in each direction, in response to a control signal of a controller (not shown).

The image sensor 12 is disposed above the stage 10, opposite and confronting the top surface of the stage 10 on which a wafer is mounted. The first and second splitters 16 and 20 are provided along a straight line between the stage 10 and the image sensor 12. The light source 14 is disposed at one side of the first splitter 16, and the reference mirror 22 is disposed at the other side. The focusing diode 18 is disposed along one side of the second splitter 20.

The alignment measuring system of FIG. 1 operates as follows. The light source 14 produces light and directs the light toward the first splitter 16. The first splitter 16 is adapted to direct a first part of the light emitted from the light source 14 toward the wafer on the stage 10, and a second part of the light emitted from the light source 14 toward the reference mirror part 22. The wafer receives the light from the splitter 16, and reflects and/or diffracts at least a portion of that light back toward the first splitter 16. The first splitter 16 passes the reflected and/or diffracted light from the wafer toward the second splitter 20. The second splitter 20 is adapted to direct a first portion of the reflected/diffracted light from the wafer toward the image sensor 12, and a second portion of the light toward the focusing diode 18. The image sensor 12 is adapted to detect light reflected vertically from the wafer, or diffracted therefrom.

The controller combines information provided through the reference mirror part 22, the focusing diode 18, and the image sensor 12 to detect a focus for a positional state of the wafer.

Subsequently, in a procedure of scanning an upper face of a wafer, the diffracted light from the wafer, namely, a light signal diffracted by an alignment mark on the wafer, is detected to check an aligned state of the wafer, thus the alignment position of the wafer is determined to control the alignment of the wafer on the stage 10.

Herewith, in the path of the light from the light source 14 to the image sensor 12, the light is dispersed toward the wafer and the reference mirror part 22 through the first splitter 16, and the light reflected from a surface of the wafer also becomes dispersed light toward the first splitter 16. The reflected light transmitted through the first splitter 16 is also dispersed toward the focusing diode 18 and the image sensor 12 through the second splitter 20.

Accordingly, the light level reaching the image sensor 12 is reduced through the many stages of dispersed light, as compared with the light first emitted by the light source 14, and this lowers the reliability of the detection of alignment position of the wafer.

An error of the alignment position causes an abnormal transfer of the pattern image, to bring about a great deal of process defects and an increased rework rate for the process, and degrades the working efficiency and productivity.

Accordingly, it would be desirable to provide an alignment measuring system in a photolithography process to increase reliability in detecting an alignment position of a wafer and prevent a process defect, and to increase the productivity and working efficiency and enhance the product quality.

To achieve these objects, an alignment measuring system of a photolithography process includes a focusing diode, a light source, an image sensor, first and second splitters, and a controller. The light source is adapted to emit light. The first splitter is adapted to direct a portion of the light emitted from the light source toward a wafer disposed on a stage, and to direct in a first direction a part of reflected light from the wafer. The second splitter is adapted to receive the part of the reflected light from the first splitter, to direct a first portion of the received light toward the image sensor, to direct a second portion of the received light toward the focusing diode, and to control levels of the first and second portions of the received light in response to an applied control signal. The image sensor is adapted to receive the first portion of the light from the second splitter and to produce a detection signal therefrom. The controller is adapted to receive the detection signal from the image sensor to determine an alignment state of the wafer, to control the stage so as to align and position the wafer, and to apply the control signal to the second splitter.

BRIEF DESCRIPTION OF THE DRAWING

The present invention will become more fully understood from the detailed description given hereinbelow and the accompanying drawings which are given by way of illustration only, and thus are not limitative of the present invention, and wherein.

DETAILED DESCRIPTION

Figure 1:
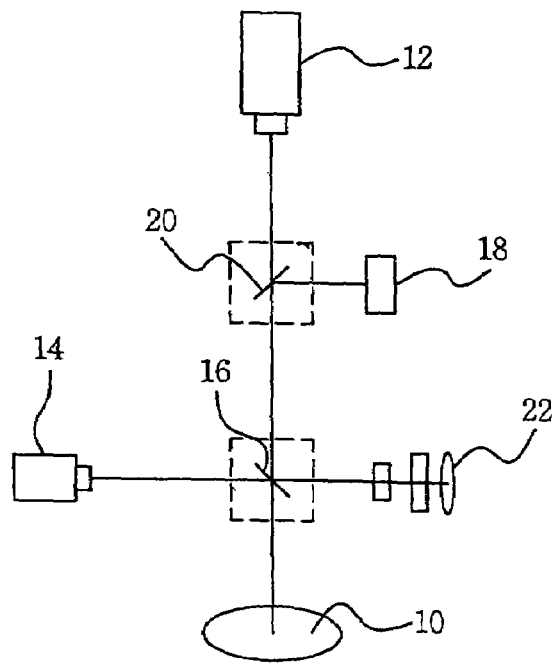
FIG. 1 is a configuration diagram schematically illustrating an alignment measuring system in a photolithography process according to a prior art.

Hereinafter, exemplary embodiments of the present invention will be described in detail with reference to FIG. 2. It will be understood by those skilled in the art that the present invention can be embodied by numerous different types and is not limited to the following described embodiments. The following various embodiments are exemplary in nature. Like reference characters refer to the same parts throughout the different views, and for purposes of clarity, a detailed description of known functions and systems has been omitted.

Figure 2:
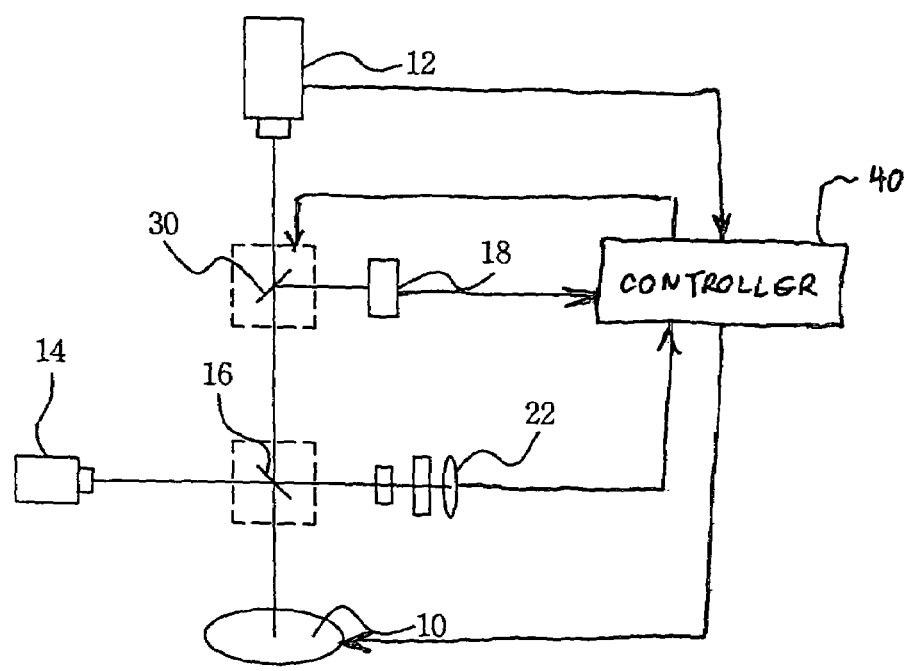
FIG. 2 is a configuration diagram schematically showing an alignment measuring system in a photolithography process according to an exemplary embodiment of the present invention.

Referring to FIG. 2, an alignment measuring system includes a light source 14, first and second splitters (i.e., beamsplitters) 16 and 30, a reference mirror 22, a focusing diode 18, an image sensor 12, and a controller 40.

The alignment measuring system operates with a stage 10 on which a wafer is positioned. The stage 10 is adapted to rotate by a given angle in a horizontal (X-axis) direction, and a vertical (Y-axis) direction, and to be ascendible and descendible with a height control in each direction, in response to a control signal of the controller 40.

The image sensor 12 is disposed above the stage 10, opposite and confronting the top surface of the stage 10 on which a wafer is mounted. The first and second splitters 16 and 30 are provided along a straight line between the stage 10 and the image sensor 12. The light source 14 is disposed at one side of the first splitter 16, and the reference mirror 22 is disposed at the other side. The focusing diode 18 is disposed along one side of the second splitter 30.

The detected light emitted from the light source 14 is partially passed through the first splitter 16 and then reaches a reference mirror part 22 positioned opposite thereto, and the controller 40 combines information provided through the reference mirror part 22, the focusing diode 18 and the image sensor 12 to detect a focus location for positioning the wafer.

In a procedure of scanning an upper face of a wafer, the diffracted light from the wafer, namely, a light signal diffracted by an alignment mark on the wafer, is detected to check an aligned state of the wafer, thus the alignment position of the wafer is determined to control the alignment of the wafer on the stage 10.

In that case, the alignment measuring system of FIG. 2 operates as follows. The light source 14 produces light and directs the light toward the first splitter 16. The first splitter 16 is adapted to direct a first part of the light emitted from the light source 14 toward the wafer on the stage 10, and a second part of the light emitted from the light source 14 toward the reference mirror part 22. The wafer receives the light from the splitter 16, and reflects and/or diffracts at least a portion of that light back toward the first splitter 16. The first splitter 16 is adapted to direct the reflected and/or diffracted light from the wafer in a first direction (e.g., toward the second splitter 30). The second splitter 30 is adapted to receive the part of the reflected light from the first splitter. The second splitter 30 is also adapted to direct a first portion of the received light (i.e., reflected/diffracted light from the wafer) toward the image sensor 12, and a second portion of the received light toward the focusing diode 18. The image sensor 12 is adapted to receive the first portion of the light (i.e., reflected/diffracted light from the wafer) from the second splitter and to produce a detection signal therefrom.

Herewith, in the alignment measuring system of FIG. 2, one or (beneficially) both of the first and second splitters 16 and 30 selectively controls the level of transmission and reflection of the light in response to a control signal from the controller 40, as explained in more detail below.

In the path of the light emitted from the light source 14 to the image sensor 12, the light is dispersed toward the wafer and the reference mirror part 22 through the first splitter 16, and the light reflected from a surface of the wafer also becomes dispersed light toward the first splitter 16. The reflected light transmitted through the first splitter 16 is also dispersed toward the focusing diode 18 and the image sensor 12 through the second splitter 30.

Thus, the light level reaching the image sensor 12 is reduced by the many stages of dispersed light, as compared with the light first emitted by the light source 14.

Accordingly, while detecting a focus for a positional state of the wafer, beneficially the second splitter 30 responds to a control signal of the controller 40 to increase the percentage of the reflected light from the wafer that it provides to the focusing diode 18, and to decrease the percentage of the reflected light that it provides to the image sensor 12. Thus, the second splitter 30 transmits a relatively large amount of the reflected light from the wafer to the focusing diode 18 (and a relatively smaller amount of the reflected light to the image sensor 12).

Also beneficially, while detecting the focus for the positional state of the wafer, the first splitter 16 responds to a control signal of the controller 40 to increase the percentage of the light from the light source 14 that it provides to the reference mirror 22, and to decrease the percentage of the light that it provides to the wafer. Thus, the first splitter 16 transmits a relatively large amount of the light to the reference mirror 22 (and a relatively smaller amount of the light to the wafer).

Meanwhile, the controller 40 combines information provided through the reference mirror 22, the focusing diode 18, and the image sensor 12 to detect a focus location for positioning the wafer. Beneficially, the focus of the image sensor 12 is adjusted using the light interference that is produced between the light that is reflected or diffracted from the wafer and passed through the first splitter 16, and the light that is reflected from the reference mirror 22 and then reflected toward the second splitter 30 by the first splitter 16. As necessary, the controller 40 applies a control signal to the stage 10 to move or position the wafer to be in focus with respect to the image sensor 12.

After detecting the focus condition for positioning the wafer, the system is ready to determine the alignment state of a wafer using reflected and/or diffracted light from the wafer's alignment mark.

While determining the alignment state of the wafer, beneficially the second splitter 30 responds to the control signal of the controller 40 to increase the percentage of the reflected and/or diffracted light from the wafer that it provides to the image sensor 12, and to decrease the percentage of the reflected light that it provides to the focussing diode 18. Thus, the second splitter 30 transmits the light reflected from the wafer (namely, diffracted light from the alignment mark), in as great an amount as possible to the image sensor 12. That is, the ratio of the power level of the first portion to the power level of the second portion is increased. In this case, the second splitter 30 also responds to the control signal of the controller 40.

Also beneficially, while determining the alignment state of the wafer, the first splitter 16 responds to a control signal from the controller 40 to increase the percentage of light provided to the wafer, and to decrease the percentage of the light that it provides reference mirror 22. Thus, the first splitter 16 transmits the light (namely, the light from the light source 14), in as great an amount as possible to the wafer. That is, the ratio of the power level of the first portion to the power level of the second portion is increased. In this case, the first splitter 16 also responds to the control signal of the controller 40.

Accordingly, the reliability of the detection of the wafer alignment position through the image sensor 12 can be enhanced.

The first and second splitters 16 and 30 may operate as follows.

In one embodiment, each of the first and second splitters 16 and 30 comprises a transparent liquid crystal display (LCD) device. A control signal from the controller 40 determines how much light is passed through each LCD by (e.g.) turning off the LCD to increase the percentage of light passing therethrough, or turning on the LCD to increase the percentage of light reflected therefrom.

In another embodiment, each of the first and second splitters 16 and 30 may be rotated under control of a control signal from the controller 40 to change the percentage of light that passes therethrough versus the percentage of light reflected therefrom.

As described above, when detecting the alignment mark, the light level provided to the image sensor through the second splitter 30 is controlled to reduce the power level of the light passed to the focusing diode 18. At the same time, this increases the power level of the light provided to the image sensor 12, to thereby guarantee a sufficient amount of light to increase the reliability of the alignment detection.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the spirit and scope of the invention as defined by the appended claims.

What is claimed is:

1. An alignment measuring system for a photolithography process, comprising:
   a focusing diode;
   a light source emitting light;
   a first splitter adapted to direct a part of the light emitted from the light source toward a wafer disposed on a stage, and to direct in a first direction light returned by the wafer;
   a second splitter adapted to receive the light from the first splitter, to direct a first portion of the received light in a second direction, to direct a second portion of the received light toward the focusing diode, and to vary respective levels of the first and second portions of the received light in response to an applied control signal;
   an image sensor adapted to receive the first portion of the light from the second splitter and to produce a detection signal therefrom; and
   a controller adapted to receive the detection signal from the image sensor to determine an alignment state of the wafer, to control the stage so as to align and position the wafer, and to apply the control signal to the second splitter.

2. The system of claim 1, where the control signal controls the second splitter to increase a power level of the second portion of the light while focusing the system, and controls the second splitter to decrease a power level of the second portion of the light while determining the alignment state of the wafer.

3. The system of claim 2 where the first splitter is adapted to direct the portion of the light emitted from the light source onto an alignment mark on the wafer.

4. The system of claim 1, further comprising a reference mirror disposed along a side of the first splitter, and adapted to receive from the first splitter a second part of the light from the light source.

5. The system of claim 4, wherein the first splitter is adapted to vary respective levels of the first and second parts of the light from the light source, under control of the controller.

6. The system of claim 5, wherein the first splitter is adapted to increase a power level of the second part of the light while focusing the system, to decrease a power level of the second part of the light while determining the alignment state of the wafer.

7. The system of claim 1, wherein the second splitter comprises a liquid crystal display device.

8. The system of claim 1, wherein each of the first and second splitters comprises a liquid crystal display device.

9. The system of claim 1, wherein the second splitter is adapted to rotate in response to the control signal.

10. The system of claim 1, wherein each of the first and second splitters is adapted to rotate under control of the controller.

11. A method of determining an alignment position of a wafer, comprising:
    generating light;
    directing a part of the generated light toward the wafer disposed on a stage;
    directing in a first direction light returned by the wafer;
    directing toward an image sensor a first portion of light returned by the wafer, said first portion having a first power level;
    directing toward a focusing diode a second portion of the light returned by the wafer, said second portion having a second power level;
    detecting a focus for a positional state of the wafer based in part on a signal produced by the focusing diode in response to the second portion of the light returned by the wafer;

varying a ratio of the first and second power levels in response to an applied control signal;

receiving at the image sensor the first portion of the reflected light; and producing an alignment detection signal from the first portion of the reflected light received by the image sensor.

12. The method of claim 11, wherein varying the ratio of the first and second power levels comprises decreasing the second power level and increasing the first power level after detecting the focus for the positional state of the wafer, and while determining the alignment state of a wafer.

13. The method of claim 11, wherein detecting a focus for a positional state of the wafer further includes;

directing a second part of the generated light toward a reference mirror; and providing light reflected from the reference mirror to the focusing diode.

14. The method of claim 13, further comprising varying a ratio of power levels of the first part of the generated light and the second part of the generated light in response to a second applied control signal.

15. The method of claim 14, wherein varying the ratio of the power levels of the first and second parts of the generated light comprises decreasing the power level of the second part and increasing the power level of the first part after detecting the focus for the positional state of the wafer, and while determining the alignment state of a wafer.

16. The method of claim 11, wherein varying a ratio of the first and second power levels in response to an applied control signal comprises turning on and off a liquid crystal display device in an optical path of the light returned by the wafer, in response to the applied control signal.

17. The method of claim 11, wherein varying a ratio of the first and second power levels in response to an applied control signal comprises rotating a mirror in an optical path of the light returned by the wafer, in response to the applied control signal.

* * * * *